United States Patent [19]

Vassiliou et al.

[11] Patent Number: 5,128,235
[45] Date of Patent: * Jul. 7, 1992

[54] METHOD OF FORMING A THREE-DIMENSIONAL OBJECT COMPRISING ADDITIVES IMPARTING REDUCTION OF SHRINKAGE TO PHOTOHARDENABLE COMPOSITIONS

[75] Inventors: Eustathios Vassiliou, Newark, Del.; Mario Grossa, Dreieich, Fed. Rep. of Germany

[73] Assignee: E. I. Du Pont de Nemours and Company, Wilmington, Del.

[*] Notice: The portion of the term of this patent subsequent to Jul. 17, 2007 has been disclaimed.

[21] Appl. No.: 341,868

[22] Filed: Apr. 21, 1989

[51] Int. Cl.$^5$ .................. G03C 9/08; G03F 7/027; B05D 3/06
[52] U.S. Cl. .................. 430/322; 430/281; 430/285; 430/269; 430/394; 430/907; 427/54.1; 264/22
[58] Field of Search ............ 430/404, 323, 281, 253, 430/257, 271, 321, 911, 394, 269, 322, 907; 522/120; 525/308, 931; 427/54.1; 264/22

[56] References Cited

U.S. PATENT DOCUMENTS

| | | | |
|---|---|---|---|
| 2,927,022 | 3/1960 | Martin et al. | 430/911 |
| 3,701,748 | 10/1972 | Kroekel | 260/40 |
| 4,005,244 | 1/1977 | Wismer et al. | 428/480 |
| 4,078,229 | 3/1978 | Swanson et al. | 340/173 CM |
| 4,151,219 | 4/1979 | Brewbaker et al. | 260/836 |
| 4,245,068 | 1/1981 | Brewbaker et al. | 525/447 |
| 4,288,861 | 9/1981 | Swainson et al. | 365/127 |
| 4,575,330 | 3/1986 | Hull | 425/174.4 |
| 4,590,242 | 5/1986 | Horn et al. | 525/183 |
| 4,654,294 | 3/1987 | Sato et al. | 522/120 |
| 4,737,445 | 4/1988 | Frommeld et al. | 430/281 |
| 4,752,498 | 6/1988 | Fudim | 427/54.1 |
| 4,942,060 | 7/1990 | Grossa | 427/54.1 |
| 4,942,112 | 7/1990 | Monroe et al. | 430/1 |
| 4,945,032 | 7/1990 | Murphy et al. | 430/322 |

FOREIGN PATENT DOCUMENTS 250121 6/1987 European Pat. Off.
1276196 10/1969 United Kingdom.

OTHER PUBLICATIONS

Kodama, Hideo; Rev. Sci. Instrum. 52(11), 1770–1773, Nov. 1981.
Herbert, Alan J.; Journal of Applied Photographic Engineering, 8(4), 185–188, Aug. 1982.

*Primary Examiner*—Charles L. Bowers, Jr.
*Assistant Examiner*—John S. Chu

[57] ABSTRACT

Method of forming an integral three-dimensional object from a photohardenable liquid composition with low shrinkage containing a linear polymer which is soluble in the liquid but separates into a separate phase upon photohardening.

7 Claims, 1 Drawing Sheet

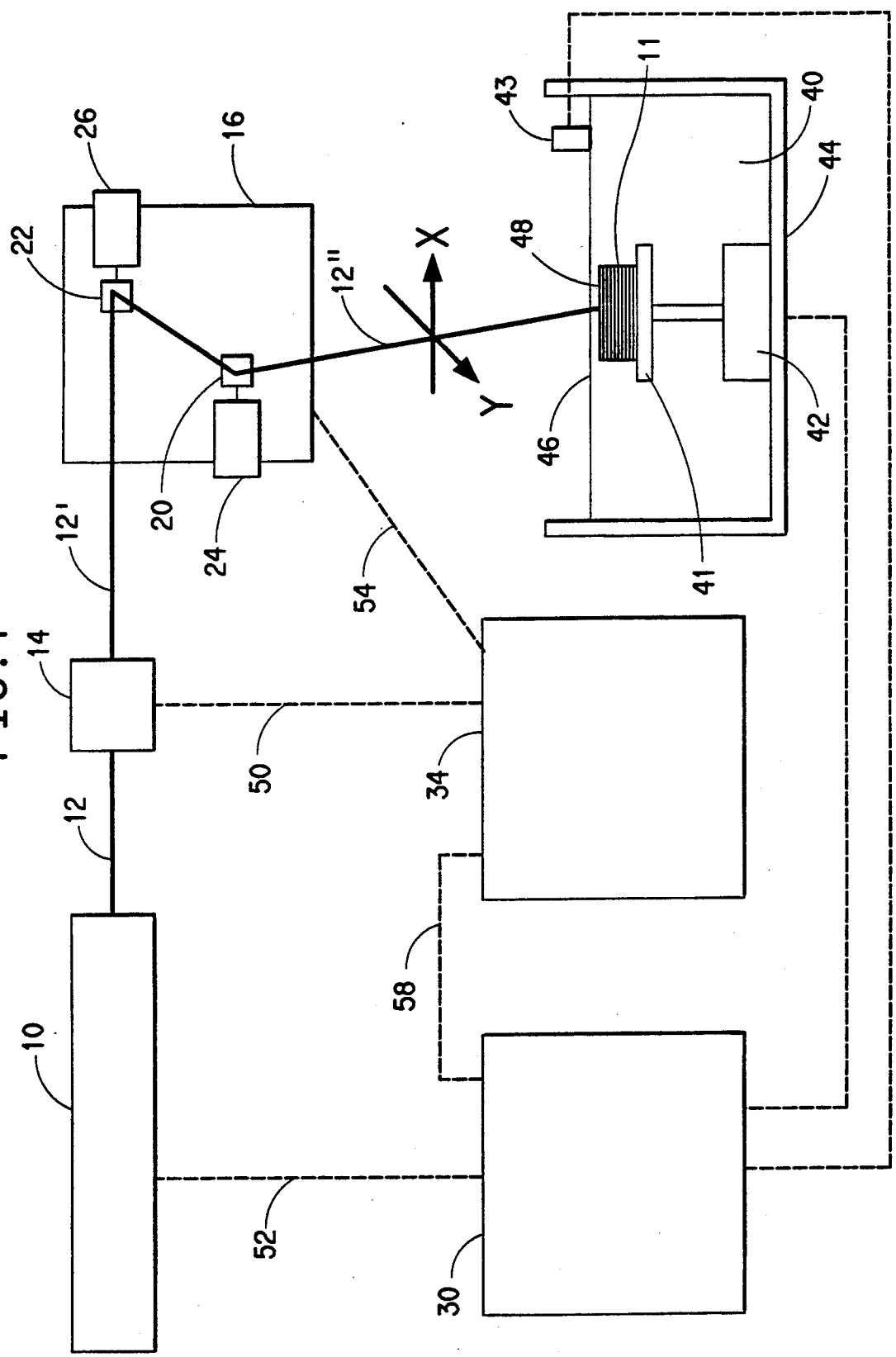

METHOD OF FORMING A THREE-DIMENSIONAL OBJECT COMPRISING ADDITIVES IMPARTING REDUCTION OF SHRINKAGE TO PHOTOHARDENABLE COMPOSITIONS

FIELD OF THE INVENTION

This invention relates to methods and compositions for producing three-dimensional objects characterized by reduced shrinkage and weaker internal stresses, which stresses are usually developed during the photohardening step.

BACKGROUND OF THE INVENTION

Many systems for production of three-dimensional modeling by photohardening have been proposed. European Patent Application No. 250,121 filed by Scitex Corp. Ltd. on Jun. 6, 1987, provides a good summary of documents pertinent to this art area, including various approaches attributed to Hull, Kodama, and Herbert. Additional background is described in U.S. Pat. No. 4,752,498 issued to Fudim on Jun. 21, 1988.

These approaches relate to the formation of solid sectors of three-dimensional objects in steps by sequential irradiation of areas or volumes sought to be solidified. Various masking techniques are described as well as the use of direct laser writing, i.e., exposing a photohardenable polymer with a laser beam according to a desired pattern and building a three-dimensional model layer by layer.

However, all these approaches fail to identify practical ways of utilizing the advantages of vector scanning combined with means to maintain constant exposure and attain substantially constant final thickness of all hardened portions on each layer throughout the body of the rigid three dimensional object. Furthermore, they fail to recognize very important interrelations within specific ranges of operation, which govern the process and the apparatus parameters in order to render them practical and useful. Such ranges are those of constant exposure levels dependent on the photohardening response of the material, those of minimum distance traveled by the beam at maximum acceleration dependent on the resolution and depth of photohardening, as well as those of maximum beam intensity depend on the photospeed of the photohardenable composition.

The Scitex patent, for example, suggests the use of photomasks or raster scanning for achieving uniform exposure, but does not suggest a solution for keeping the exposure constant in the case of vector scanning. The use of photomasks renders such techniques excessively time consuming and expensive. Raster scanning is also undesirable compared to vector scanning for a number of reasons, including:

necessity to scan the whole field even if the object to be produced is only a very small part of the total volume, considerably increased amount of data to be stored in most cases, overall more difficult manipulation of the stored data, and the necessity to convert CAD-based vector data to raster data.

On the other hand, in the case of vector scanning only the areas corresponding to the shape of the rigid object have to be scanned, the amount of data to be stored is smaller the data can be manipulated more easily, and "more than 90% of the CAD based machines generate and utilize vector data" (Lasers & Optronics, January 1989, Vol. 8, No. 1, pg. 56). The main reason why laser vector scanning has not been utilized extensively so far is the fact that, despite its advantages, it introduces problems related to the inertia of the optical members, such as mirrors, of the available deflection systems for the currently most convenient actinic radiation sources, such as lasers. Since these systems are electromechanical in nature, there is a finite acceleration involved in reaching any beam velocity. This unavoidable non-uniformity in velocity results in unacceptable thickness variations. Especially in the case of portions of layers having no immediate previous levels of exposure at the high intensity it becomes necessary to use high beam velocities, and therefore, longer acceleration times, which in turn result in thickness non-uniformity. The use of low intensity lasers does not provide a good solution since it makes production of a solid object excessively time consuming. In addition, the usefulness of vector scanning is further minimized unless at least the aforementioned depth and exposure level relationships are observed as evidenced under the Detailed Description of this invention.

No special attention has been paid so far to the composition itself by related art in the field of solid imaging, except in very general terms.

Thus, the compositions usually employed, present a number of different problems, one of which is lack of good dimensional control, especially during the step of photohardening. Photohardening, is usually followed by shrinkage which in turn gives rise to internal stresses. Shrinkage itself results in parts which are smaller than intended to be, and internal stresses may result in warpage and cracking, as well as strength reduction.

In other fields of art, reduction of shrinkage has been proposed for different purposes.

U.S. Pat. No. 4,590,242 (Horn et al.) describes low shrinkage nylon molding compositions comprising lactam monomer and a polymer which separates out in the course of photohardening. The polymer is composed of one or more blocks which are compatible with polylactam and one or more blocks which are incompatible therewith.

U.S. Pat. No. 4,245,068 (Brewbaker et al.) describes thermosettable compositions comprising an unsaturated polyester and a vinyl monomer capable of crosslinking the polyester, where the shrinkage is reduced during cure by the addition to the composition of an alkylene oxide polymer which is soluble in the thermosettable composition but which is substantially soluble in the cured thermoset composition.

U.S. Pat. No. 4,151,219 (Brewbaker et al.) describes similar compositions as U.S. Pat. No. 4,245,068.

U.S. Pat. No. 3,701,748 (Kroekel) describes a composition curable under heat and pressure for molding, containing a thermoplastic polymer which is soluble in the composition, but yields an optically heterogeneous cured composition.

British Patent 1,276,198 describes similar compositions as U.S. Pat. No. 3,701,748.

U.S. Pat. Nos. 4,078,229, 4,288,861, and 4,446,080 (Swainson et al.) describe holographic techniques utilizing two or more beams for multiple proton absorption for production of physical or refractive index inhomogeneities at the intersection of the beams.

It is therefore an object of the present invention to provide compositions and a method for producing parts by solid imaging, characterized by improved dimensional control, reduced warpage potential, and greater strength.

SUMMARY OF THE INVENTION

The instant invention is directed to compositions and methods for direct production of three-dimensional photohardened solid objects, layer by layer using actinic radiation, preferably in a beam form such as provided by lasers for direct writing, wherein the produced solid object is characterized by improved dimensional control, reduced warpage potential, and greater strength. This invention may be summarized as follows:

A photohardenable composition characterized by low or no shrinkage upon photohardening, for use in solid imaging, comprising an ethylenically unsaturated monomer, a photoinitiator, and an additive mixed therein, the additive being soluble in the composition but separating into a separate phase upon photohardening the composition, the additive occupying a first volume in the absence of all other components of the composition, the photohardenable composition occupying a second volume in the absence of the additive mixed therein, and the photohardenable composition containing the additive occupying a third volume, wherein the third volume is smaller than the sum of the first volume and the second volume.

The invention also includes a method for accurately fabricating an integral three dimensional object from successive layers of a photohardenable liquid composition comprising the steps of:

(a) forming a layer of a photohardenable liquid;
(b) photohardening at least a portion of the layer of photohardenable liquid by exposure to actinic radiation;
(c) introducing a new layer of photohardenable liquid onto the layer previously exposed to actinic radiation;
(d) photohardening at least a portion of the new liquid layer by exposure to actinic radiation, with the requirement that the photohardenable composition comprises an ethylenically unsaturated monomer, a photoinitiator, and an additive mixed therein, the additive being soluble in the composition but separating into a separate phase upon photohardening the composition, the additive occupying a first volume in the absence of all other components of the composition, the photohardenable composition occupying a second volume in the absence of the additive mixed therein, and the photohardenable composition containing the additive occupying a third volume, wherein the third volume is smaller than the sum of the first volume and the second volume.

BRIEF DESCRIPTION OF THE DRAWING

The reader's understanding of practical implementation of preferred embodiments of the invention will be enhanced by reference to the following detailed description taken in conjunction with perusal of the drawing FIGURE, wherein:

FIG. 1 is a block diagram of an apparatus used to perform the preferred embodiment of the process of the instant invention.

DETAILED DESCRIPTION OF THE INVENTION

The instant invention is directed to compositions and methods for direct production of three-dimensional photohardened solid objects, layer by layer using actinic radiation, preferably in a beam form such as provided by lasers for direct writing, wherein the produced solid object is characterized by improved dimensional control, reduced warpage potential, and greater strength.

As aforementioned, many systems for production of three-dimensional modeling by photohardening have been proposed. European Patent Application No. 250,121 filed by Scitex Corp. Ltd. on Jun. 6, 1987, provides a good summary of documents pertinent to this art area, including various approaches attributed to Hull, Kodama, and Herbert. Additional background is described in U.S. Pat. No. 4,752,498 issued to Fudim on Jun. 21, 1988.

In a preferred embodiment, an apparatus for practicing the present invention is depicted in FIG. 1, in the form of a block diagram. The apparatus and its operation are described below.

Actinic radiation means 10 shown in FIG. 1, which is preferably a high power laser, is used to provide an actinic radiation beam 12 having a certain intensity. The radiation beam 12 is passed through a modulator 14, where its intensity may be modulated. The modulated beam 12' is passed in turn through deflection means 16 such as a vector scanner in the form of a two-mirror 20 and 22 assembly, each mirror separately driven by a different motor 24 and 26 respectively. By causing mirror 20 driven by motor 24 to turn, the beam is deflected in an X direction, while by causing mirror 22 to turn, the beam is deflected in a Y direction, X direction being perpendicular to the Y direction. The actinic radiation beam 12" is thus controllably deflected towards preselected portions of the photohardenable composition which is contained in vessel 44 and presents a surface 46. It photohardens a thin layer 48 closest to the surface 46 of a photohardenable composition 40, to a depth of photohardening which equals the maximum thickness of the layer 48. The composite movement of the beam is preferably a vector type movement, and the beam is said to move or be scanned in a vector mode. Due to the inertia of the electromechanical deflection means 16, the velocity of the beam 12" on the thin layer 48 is also limited by the inertia and the electromechanical nature of the deflection means 16.

The deflection of the two mirrors 20 and 22 through motors 24 and 26 respectively is controlled by the second computer control means 34, while the graphic data corresponding to the shape of the solid object under production are stored in the first computer control means 30.

The second computer control means 34 is coupled with the modulation means 14, the deflection means 16, and the first computer control means 30, through control/feedback lines 50, 54, and 58, respectively. The graphic data stored in computer control means 30 are fed to computer control means 34, and after being processed cause motors 24 and 26 to turn and move mirrors 20 and 22 accordingly in order to deflect the beam towards predetermined positions on the thin layer 48. Electrical feedback regarding the relative movements of the mirrors 20 and 22 is provided by the deflection means to the second computer control means 34 through line 54.

The manner of introducing successive layers of photohardenable liquid and exposing to actinic radiation such as a laser will generally be by two methods. In a first method a pool of liquid is present in a vessel and it is not necessary to introduce additional photohardenable liquid. In such case a movable table or floor supports the liquid. Initially the table or floor is elevated with a portion of the photohardenable liquid present above the table or floor and a portion of the liquid present in the vessel around the edge of the table or floor and/or underneath it. (Illustratively a table is present which allows liquid to flow underneath the table as it is used.) After exposure and photohardening of a portion of the liquid layer above the table, the table is lowered to allow another layer of photohardenable liquid to flow on top of the previous layer followed by exposure of predetermined area on the newly applied liquid layer. If necessary due to the shape of the final three dimensional article the thickness of more than one liquid layer can be photohardened. This procedure of table or floor lowering and exposure continues until formation of the desired three dimensional article occurs.

In a second method a movable table or floor need not be employed but rather a new quantity of photohardenable liquid is introduced into a vessel after an exposure step in formation of a new liquid layer on a previously exposed layer containing both photohardened material and photohardenable liquid. Criticality is not present in the manner of liquid introduction but rather in an ability to photoharden successive liquid layers.

In FIG. 1, a movable table 41 is initially positioned within the photohardenable composition 40, a short predetermined distance from the surface 46, providing a thin layer 48 between the surface 46 and the table 41. The positioning of the table is provided by the placement means 42, which in turn is controlled by the first computer control means 30 according to the data stored therein. The graphic data corresponding to the first layer of the shape of the rigid object are fed from computer control means 30 to computer control means 34, where they are processed along with feedback data obtained from deflecting means 16, and are fed to modulator 14 for controlling the same, so that when the beam travels in a vector mode on predetermined portions of the thin layer 48, the exposure remains constant.

When the first layer of the rigid object is complete, the movable table 41 is lowered by a small predetermined distance by the placement means 42 through a command from first computer control means 30. Following a similar command from computer means 30, layer forming means, such as doctor knife 43 sweeps the surface 46 for leveling purposes. The same procedure is then followed for producing the second, third, and the following layers until the rigid object is completed.

In the discussions above and below, the actinic radiation, preferably in the form of a beam, is many times referred to as light, or it is given other connotations. This is done to make the discussion clearer in view of the particular example being described. Thus, it should not be taken as restricting the scope and limits of this invention. Nevertheless, the preferred actinic radiation is light, including ultraviolet (UV), visible, and infrared (IR) light. From these three wavelength regions of light, ultraviolet is even more preferred.

The formulation of the photohardenable compositions for solid imaging purposes is very important in order to receive the desirable effects and characteristics, regardless of whether the scanning is of the vector type, raster type, or any other type, and the discussion hereinafter is referred to in any type of scanning, unless otherwise stated. However, from the different types of scanning, the vector type is the preferred type of scanning.

A photohardenable composition for solid imaging should contain at least one photohardenable monomer or oligomer and at least one photoinitiator. For the purposes of this invention, the words monomer and oligomer have substantially the same meaning and they may be used interchangeably.

Examples of suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di(p-hydroxyphenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are ethoxylated trimethylolpropane triacrylate, ethylated pentaerythritol triacrylate, dipentaerythritol monohydroxypentaacrylate 1,10-decanediol dimethylacrylate, di-(3-acryloxy-2-hydroxylpropyl)ether of bisphenol A oligomers, di-(3-methacryloxy-2-hydroxyl alkyl)ether of bisphenol A oligomers, urethane diacrylates and methacrylates and oligomers thereof, coprolactone acrylates and methacrylates, propoxylated neopentyl glycol diacrylate and methacrylate, and mixtures thereof.

Examples of photoinitiators which are useful in the present invention alone or in combination are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; α-hydrocarbon-substituted aromatic acyloins, including α-methylbenzoin α-allylbenzoin, α-phenylbenzoin, 1-hydroxylcyclohexyl phenol ketone, diethoxyphenol acetophenone, 2-methyl-1-[4-(methylthio)-phenyl]-2-morpholino-propanone-1. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S Pat. Nos. 3,427,161, 3,479,185 and 3,549,367 can be used as initiators. Also useful with photoinitiators and photoinhibitors are sensitizers disclosed in U.S. Pat No. 4,162,162. The photoinitiator or photoinitiator system is present in 0.05 to 10% by weight based on the total weight of the photohardenable composition. Other suitable photoinitiation systems which are thermally inactive but which generate free radicals upon exposure to actinic light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione.

Although the preferred mechanism of photohardening is free radical polymerization, other mechanisms of photohardening apply also within the realm of this invention. Such other mechanisms include but are not limited to cationic polymerization, anionic polymerization, condensation polymerization, addition polymerization, and the like.

Other components may also be present in the photohardenable compositions, e.g., pigments, dyes, extenders, polymerization inhibitors, interlayer and generally interfacial adhesion promoters, such as organosilane coupling agents, dispersants, surfactants, plasticizers, coating aids such as polyethylene oxides, etc. so long as the photohardenable compositions retain their essential properties.

The instant invention is intended for solid imaging techniques which use compositions that shrink upon photohardening, which is the rule rather than the exception. The shrinkage, not only changes the intended dimensions of the rigid object, but it also causes high internal stresses which may lead to unacceptable levels of warpage. Warpage may be highly aggravated by any heat cycles or treatments of the rigid object, especially when it involves thermal curing, and thus it should be avoided.

According to this invention, an additive compound is included in the photohardenable composition, which is soluble in the composition before photohardening, but which becomes at least partially insoluble after the composition has been photohardened. In addition, the volume occupied by the photohardenable composition with the additive compound dissolved therein before photohardening, should be smaller than the sum of the volume of the photohardenable composition without the additive compound mixed therein, and the volume of the free additive compound. These volumes may be measured either directly or indirectly, if more convenient, through weight and density measurements. When these conditions are met, the shrinkage due to photohardening, is reduced by the volume increase due to the phase separation.

In other words, the composition should comprise an ethylenically unsaturated monomer, a photoinitiator, and an additive mixed therein, the additive being soluble in the composition but separating into a separate phase upon photohardening the composition, the additive occupying a first volume in the absence of all other components of the composition, the photohardenable composition occupying a second volume in the absence of the additive mixed therein, and the photohardenable composition containing the additive occupying a third volume, wherein the third volume is smaller than the sum of the first volume and the second volume.

In these cases the specific gravity of the composition containing the additive is larger than what would be expected by a straightforward calculation based on the specific gravity of the additive itself and the specific gravity of the composition containing no additive.

The amount of the separated phase upon photohardening should be at least 5%, and preferably at least 10% of the total volume and distributed in domains having an average diameter smaller than the depth of photohardening, the depth of photohardening being preferably smaller than 20 thousandths of one inch (500 micrometers). More preferably, the average diameter of the domains should be smaller than one half the depth of photohardening, or smaller than 10 thousandths of one inch (250 micrometers). Domain size and volume determinations may be very easily conducted by examining cross sections of the photohardened composition using surface analysis techniques, well known in the art.

Although different compounds other than polymers may be employed, the preferable way of utilizing this invention is to employ a polymer, called secondary polymer hereinafter, which preferably is a linear polymer. Polystyrene, poly alpha methyl styrene and in general poly alpha or beta alkyl styrenes, substituted polystyrenes with such groups as alkyl, alkoxy and the like, or mixtures thereof, are some examples of secondary polymers useful for the purposes of this invention. The number average molecular weight should preferably be between 1000 and 500,000, more preferably between 10,000 and 250,000, and even more preferably, between 20,000 and 250,000. The higher the molecular weight the better with regard to ease of separation from the photohardened composition, but the viscosity of the composition before photohardening is also raised, which may be undesirable in certain occasions. In such occasions the value of the molecular weight has to be compromised to an intermediate value. Of course, in any case, the secondary polymer has to be soluble in the composition before the photohardening step. The content of the secondary polymer in the photohardenable composition should be between 5% and 95%, more preferably 10%-50%, and even more preferably 20% to 30%, as measured or calculated by weight.

A possible mechanism could be that before photohardening of the monomers or oligomers, the bonds between groups of the secondary polymer and groups of the monomers or oligomers are strong enough to keep the oligomeric molecules in conformity with and as close as possible to the secondary polymer so that the solution occupies a certain volume However, upon photohardening of the monomers or oligomers, these bonds fail to keep the big molecules of the two polymers together, and phase separation occurs usually manifesting itself as a measurable volume increase. As aforementioned, the incompatibility and phase separation increase as the molecular weight of the polymers involved increases. The molecular weight of the secondary polymer is, of course, pre-selected in the composition, while the molecular weight of the polymer formed from the monomers and oligomers contained in the composition can be varied depending on the irradiation exposure. Thus, higher incompatibility will occur with increased exposure levels. An important difference between the secondary polymer and the one formed during photohardening of the composition is that the former is linear in order to be substantially soluble in the monomers and oligomers of the composition, while the latter is usually crosslinked as resulting from multifunctional entities.

In the following discussion a clear distinction should be made between a photohardenable and a photohardened composition. The former refers to one which has not yet been subjected to irradiation, while the latter refers to one which has been photohardened by irradiation.

The secondary polymer may be a homopolymer, such as polystyrene, substituted polystyrene, etc., or it may be a copolymer. Many techniques may be employed to make and use a secondary polymer in the form of a copolymer. If one homopolymer is insoluble in the photohardenable composition, one can make it soluble by incorporating another monomer into the polymeric structure to render the final secondary polymer soluble. For example, if homopolymer C, resulting from monomer C', is insoluble in the photohardenable composition, and homopolymer D, resulting from monomer D', is soluble in the photohardenable composition, then the copolymer of C' and D' containing the minimum amount of D' that is adequate to render the copolymer soluble in the composition will be suitable to be used as a secondary polymer. Using this technique to make and evaluate an appropriate secondary polymer, one should try to keep the different variables such as molecular weight, content, etc., constant. A more specific and illustrative example would be one where polystyrene for instance is insoluble in the photohardenable composition but polymethyl methacrylate of the similar molecular weight is soluble. One can make then copolymers of similar molecular weight with increasing amounts of methyl methacrylate until the copolymer becomes soluble in the photohardenable composition.

If the secondary polymer of the separated phase is grossly incompatible with the rest of the photohardened composition, depending on the relative amounts present, weakening of the structure of the rigid object formed by this process may occur. The weak areas will be at the interface of the two phases. This may be corrected by incorporating on the secondary polymer a small amount of groups which are compatible with the rest of the photohardenable composition as discussed above. Incorporation of such groups over a certain amount will have a tendency to initially improve dipersibility of the otherwise coarsely separated phase in the rest of the composition, and finally even dissolve the same. This will have two major effects which will have to be compromised; one will be smaller volume increase, and the other better adhesion of each phase to the other. As the amount of these groups increases, the volume increase will be smaller but the interface adhesion will be better until complete dissolution occurs. If for example homopolymer A, resulting from monomer A', is dissolved in the photohardenable composition and after photohardening it becomes incompatible with the rest of the composition, and if homopolymer B, composition and after photopolymerization it remains dissolved, then a copolymer of A' and B' would be a suitable combination. The relative amounts of A' and B' should be such that the best compromise, if there is one, between part strength and final shrinkage is achieved. The way that this can be done is by making copolymers of A' with increasing amounts of B', dissolving them individually in the photohardenable composition, photohardening the resulting compositions into specimens, and subjecting the specimens to strength tests such as tensile strength, modulus, elongation, impact, and the like, as well as shrinkage determination by measuring for example the specific gravity of the specimen and comparing it with that of the liquid photohardenable composition before photohardening. These techniques of evaluating the mentioned properties are well known and established in the art, and therefore, do not warrant further explanations. The selection of which particular testing techniques to employ depends on the end-use of the rigid object to be made, and the desired properties.

More than two monomers may be used for the synthesis of the secondary polymers as long as the rules set forth above are followed. Also, small amounts of photoreactive bonds, preferably in the form of ethylenical unsaturation, may be incorporated in the structure of the secondary polymer to enhance the mechanical properties of the rigid object. One example would be to introduce allyl groups, for instance allyl acrylate or methacrylate, in the secondary polymer structure. This unsaturation which is less reactive than the acrylic or methacrylic unsaturation, would not prevent the formation of a linear secondary polymer, for instance one comprising styrene and allyl acrylate or methacrylate, but it would provide the allyl double bonds to be copolymerized with the monomers of the rest of the composition during photohardening. In another example, a basic secondary polymer containing hydroxyl groups, such as a copolymer of styrene and hydroxy alkyl acrylate or methacrylate may be reacted with isocyanato alkyl acrylate or methacrylate or the like to produce a reactive secondary polymer containing acrylic bonds. In still another example the basic secondary polymer may contain carboxyl groups, which may be reacted with glycidyl acrylate or methacrylate to provide the desired acrylic bonds.

Of course, in such cases also, an excessive amount of reactive bonds may result in preventing the formation of the second phase, and a compromise between volume increase and part strength should be considered, by using the test procedures described above. Also, attempts to incorporate excessive amounts of reactive bonds may result to a polymer which is not soluble any more to the rest of the photohardenable composition, and therefore unacceptable for the purposes of this invention.

The preferred range of weight of secondary polymer per double bond or other type of ethylenical unsaturation in grams (equivalent weight) is 200 to 20,000, more preferably 500 to 10,000, and even more preferably 1,000 to 5,000 per unsaturated site. Examples of photohardenable compositions are given below for illustration purposes only, and should not be construed as restricting the scope or limits of this invention.

EXAMPLE 1

The following ingredients were mixed:

| | |
|---|---|
| Isodecylacrylate $CH_3(CH_3)CH[CH_2]_7 OCOCH=CH_2$ | 80 g |
| Benzildimethylketal | 1 |
| Polystyrene (Molecular Weight 250,000) | 20 |

The photohardenable composition thus made was placed in a cylindrical container and solidified by exposure to 300 mJ/cm$^2$, at 360 nanometers, using a fluorescent ultraviolet lamp. The density was measured, and from this, the experimental shrinkage was determined. For comparison purposes, the theoretical shrinkage was also calculated by taking into account the dilution effect caused by the dissolved polymer. In the absence of dissolved polymer, the theoretical shrinkage has by definition the same value as the experimental shrinkage.
In this case:
Theoretical shrinkage: 5%
Experimental shrinkage: 1.98%

EXAMPLE 2

The following ingredients were mixed:

| | |
|---|---|
| Isodecylacrylate $CH_3(CH_3)CH[CH_2]_7 OCOCH=CH_2$ | 99 g |
| Benzildimethylketal | 1 |

The photohardenable composition, thus made, was treated as in Example 1
In this case:
Theoretical shrinkage: 5.14%
Experimental shrinkage: 5.14%

EXAMPLE 3

The following ingredients were mixed:

| | |
|---|---|
| Methylmethacrylate | 70 |
| CIBA GEIGY CG 250369 | 1 |
| Polystyrene (Molecular Weight 250000) | 30 |

CIBA GEIGY 250369 is an acetophenone derivative with a morpholino substituent.
The photohardenable composition, thus made, was treated as in Example 1.
In this case:
Theoretical shrinkage: 13.3%
Experimental shrinkage: 9.0%

EXAMPLE 4

The following ingredients were mixed:

| | |
|---|---|
| Methylmethacrylate | 80 |
| CIBA GEIGY CG 250369 | 4.17 |
| Polystyrene | 20 |
| (Molecular Weight 250,000) | |

The photohardenable composition, thus made, was treated as in Example 1.
In this case:
Theoretical shrinkage: 15.5%
Experimental shrinkage: 14.6%

EXAMPLE 5

The following ingredients were mixed:

| | |
|---|---|
| Methylmethacrylate | 96 |
| CIBA GEIGY CG 250369 | 4 |

The photohardenable composition, thus made, was treated as in Example 1.
In this case:
Theoretical shrinkage: 18.8%
Experimental shrinkage: 18.8%

What is claimed is:

1. A method for accurately fabricating an integral three dimensional object from successive layers of a photohardenable liquid composition comprising the steps of:
   (a) forming a layer of a liquid photohardenable liquid;
   (b) photohardening at least a portion of the layer of photohardenable liquid by exposure to actinic radiation;
   (c) introducing a new layer of photohardenable liquid onto the layer previously exposed to actinic radiation; and
   (d) photohardening at least a portion of the new liquid layer by exposure to actinic radiation, with the requirement that the photohardenable composition comprises an ethylenically unsaturated monomer, a photoinitiator, and a linear polymer mixed therein selected from the group consisting of polystyrene, substituted polystyrene, alpha alkyl polystyrene, beta alkyl polystyrene, substituted alpha alkyl polystyrene, substituted beta alkyl polystyrene, and mixture thereof, the linear polymer being soluble in the composition but separating into a separate phase upon photohardening the composition, the linear polymer occupying a first volume in the absence of all other components of the composition, the photohardenable composition occupying a second volume in the absence of the linear polymer mixed therein, and the photohardenable composition containing the linear polymer occupying a third volume,
wherein the third volume is smaller than the sum of the first volume and the second volume.

2. The method of claim 1 wherein steps (c) and (d) are successively repeated.

3. The method as described in claim 1, wherein the separate phase of the photohardenable composition is in form of domains having an average diameter smaller than 250 micrometers, and wherein the separate phase has a volume constituting at least 10% of the total volume of the composition after photohardening.

4. The method as described in claim 1, wherein the additive compound is between 10% and 50% of the total photohardenable composition, by weight.

5. The method as described in claim 1, wherein the polymer has a number average molecular weight between 10,000 and 250,000.

6. The method as described in claim 1, wherein the polymer is a copolymer comprising a first monomer and a second monomer,
- the first monomer corresponding to a homopolymer, which is soluble in the photohardenable composition before photohardening but separates into a second phase upon photohardening,
- the second monomer corresponding to a homopolymer, which is soluble in the photohardenable composition both before and after photohardening.

7. The method as described in claim 1, wherein the polymer has ethylenical unsaturation, the ethylenical unsaturation having an equivalent weight between 1,000 and 5,000 grams per unsaturated site.

* * * * *